United States Patent
Furuhata

(10) Patent No.: US 6,828,681 B2
(45) Date of Patent: Dec. 7, 2004

(54) SEMICONDUCTOR DEVICES HAVING CONTACT PADS AND METHODS OF MANUFACTURING THE SAME

(75) Inventor: Tomoyuki Furuhata, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/053,910

(22) Filed: Jan. 24, 2002

(65) Prior Publication Data

US 2002/0121701 A1 Sep. 5, 2002

(30) Foreign Application Priority Data

Jan. 24, 2001 (JP) ........................................ 2001-015671

(51) Int. Cl.$^7$ ......................... H01L 23/52; H01L 29/40
(52) U.S. Cl. .................. 257/758; 257/690; 257/698; 257/748
(58) Field of Search ............................. 257/758, 690, 257/698, 748

(56) References Cited

U.S. PATENT DOCUMENTS

| | | | | |
|---|---|---|---|---|
| 4,984,061 A | * | 1/1991 | Matsumoto | 257/579 |
| 5,149,674 A | * | 9/1992 | Freeman et al. | 438/612 |
| 5,700,735 A | * | 12/1997 | Shiue et al. | 438/612 |
| 5,736,791 A | * | 4/1998 | Fujiki et al. | 257/698 |
| 5,820,926 A | * | 10/1998 | Lien | 427/162 |
| 5,939,790 A | * | 8/1999 | Gregoire et al. | 257/773 |
| 6,197,685 B1 | * | 3/2001 | Domae et al. | 438/622 |
| 6,313,537 B1 | * | 11/2001 | Lee et al. | 257/758 |
| 6,362,528 B2 | * | 3/2002 | Anand | 257/758 |
| 6,476,491 B2 | * | 11/2002 | Harada et al. | 257/758 |

FOREIGN PATENT DOCUMENTS

| | | |
|---|---|---|
| JP | 64-081236 | 3/1989 |
| JP | 08-213422 | 8/1996 |
| JP | 11-145288 | 5/1999 |
| JP | 11-186320 | 7/1999 |

OTHER PUBLICATIONS

Notice of Reasons of Rejection for Japanese Patent Application No. 2001–015671 (from which priority is claimed in U.S. Ser. No. 10/053,910), dated Mar. 25, 2003, which lists JP11–186320, JP08–213422, JP64–081236, and JP11–145288.

* cited by examiner

*Primary Examiner*—David Nelms
*Assistant Examiner*—Tu-Tu Ho
(74) *Attorney, Agent, or Firm*—Konrad Raynes & Victor, LLP; Alan S. Raynes

(57) ABSTRACT

A semiconductor device 1000 may include a protective insulation layer 50, a pad opening section 60 provided in the protective insulation layer 50, and a wiring layer which the pad opening section reaches. First and second wiring layers 30 and 32 are provided at levels below the wiring layer 40 which the pad opening section reaches. The first and second wiring layers 30 and 32 provided at levels below the wiring layer 40 which the pad opening section reaches are formed outside a region of the pad opening section 60 as viewed in a plan view.

27 Claims, 7 Drawing Sheets

Fig. 9 (a) (Prior Art)
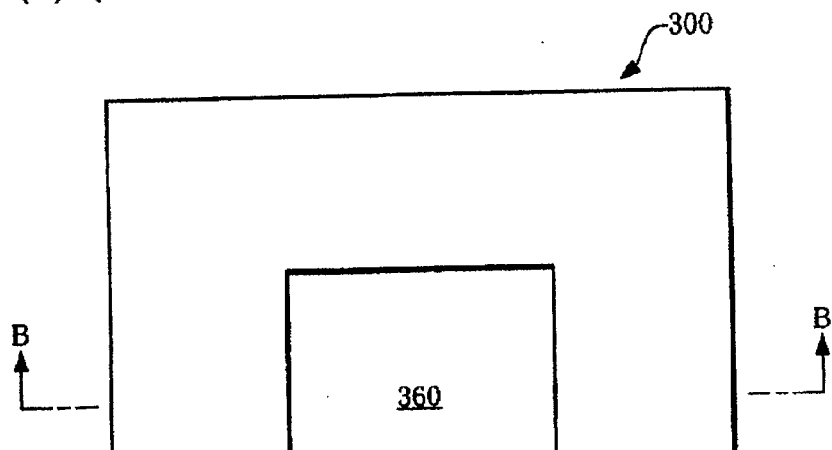
Fig. 9 (b) (Prior Art)
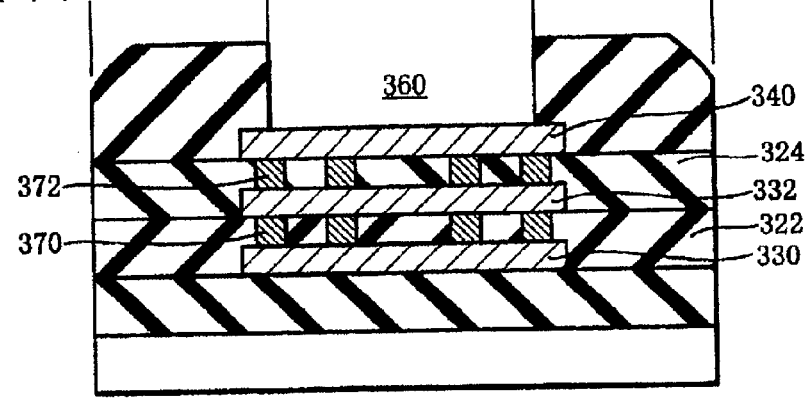

SEMICONDUCTOR DEVICES HAVING CONTACT PADS AND METHODS OF MANUFACTURING THE SAME

Applicant hereby incorporates by reference Japanese Application No. 2001-015671, filed Jan. 24, 2001, in its entirety.

TECHNICAL FIELD

The present invention includes semiconductor devices having a bonding pad region and methods for manufacturing the same.

RELATED ART

Presently, with further miniaturization of semiconductor devices being advanced, wiring layers in semiconductor devices are formed in multiple layers. A semiconductor device is generally provided with a pad opening section that reaches the uppermost layer among the wiring layers. The exterior and the uppermost layer among the wiring layers are electrically connected through the pad opening section.

FIG. 9 schematically shows a cross-sectional view of a pad forming region of a semiconductor device. Generally, wiring layers 332 and 330 that are formed at a level below the wiring layer 340 which the pad opening section reaches are also formed in a region below the pad opening section 360. However, when the wiring layers 332 and 330 are formed in a region below the pad opening section 360, cracks 310 may be generated in interlayer insulation layers 322 and 324, when wiring bonding is carried out at the pad opening section 360.

SUMMARY

Certain embodiments relate to a semiconductor device including a protective insulation layer, a pad opening section provided in the protective insulation layer, a wiring layer which the pad opening section reaches, and a wiring layer provided at a level lower than the upper wiring layer. The wiring layer provided at a level lower than the wiring layer which the pad opening section reaches is formed outside a region of the pad opening section as viewed in a plan view.

Embodiments also relate to a semiconductor device including a first wiring layer formed above a semiconductor layer through a first interlayer insulation layer, a second wiring layer that provides a pad section formed above the first wiring layer through a second interlayer insulation layer, a protective insulation layer formed above the second wiring layer and the second interlayer insulation layer, and a pad opening section provided in the protective insulation layer. An upper surface of the first interlayer insulation layer includes a first region where the protective insulation layer is formed vertically thereabove, and the first wiring layer is formed on the first region.

Embodiments also relate to a method for manufacturing a semiconductor device, the method including the steps of: (a) forming a wiring layer on an interlayer insulation layer; (b) forming a protective insulation layer on the interlayer insulation layer and the wiring layer; and (c) forming a pad opening section in the protective insulation layer, which reaches the wiring layer. The semiconductor device is formed to include a wiring layer provided at a level lower than the wiring layer to which the pad opening section reaches. The pad opening section is formed such that the wiring layer provided at a level lower than the wiring layer to which the pad opening section reaches is formed outside a region of the pad opening section as viewed in a plan view.

Embodiments also relate to a method for manufacturing a semiconductor device, including forming a lower level wiring layer; forming an lower level interlayer dielectric layer on and adjacent to the lower level wiring layer; forming an upper level wiring layer above the lower level interlayer dielectric layer, wherein the lower level wiring layer is electrically connected to the upper level wiring layer; and forming a protective insulation layer on the upper level wiring layer. The method also includes removing a first portion of the protective insulation layer over the upper level wiring layer and over the lower level interlayer dielectric layer to form a pad opening section in the upper level wiring layer, wherein a second portion of the protective insulation layer located vertically above the lower level wiring layer remains after removing the first portion of the protective layer; and wherein no portion of the lower level wiring layer is disposed vertically below the pad opening section.

BRIEF DESCRIPTION OF THE DRAWINGS

Embodiments of the invention are described with reference to the accompanying drawings which, for illustrative purposes, are schematic and not necessarily drawn to scale.

FIG. 9(a) schematically shows a plan view of a semiconductor device in accordance with a conventional example, and FIG. 9(b) schematically shows a cross-sectional view taken along lines B—B of FIG. 9(a).

DETAILED DESCRIPTION

Figure 1:
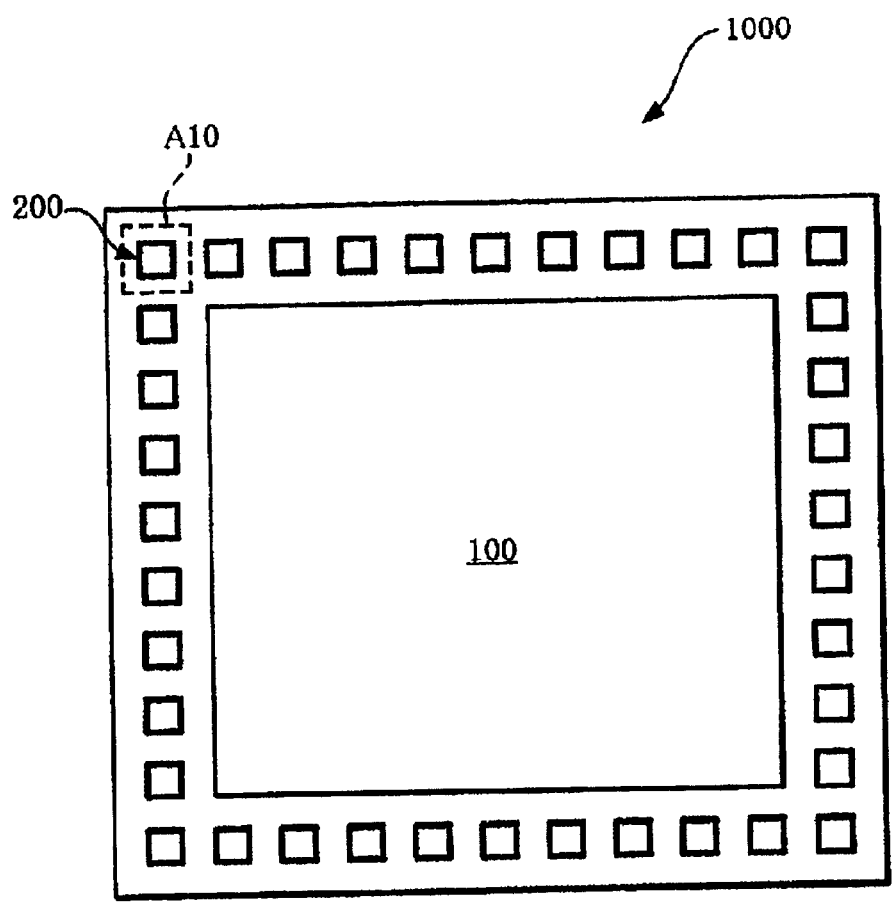
FIG. 1 schematically shows a cross-sectional view of a semiconductor device in accordance with one embodiment of the present invention.

Certain embodiments of the present invention provide semiconductor devices in which generation of cracks in interlayer insulation layers below a wiring layer which a pad opening section reaches is suppressed and methods for manufacturing the same. A first semiconductor device in accordance with certain embodiments of the present invention comprises: a protective insulation layer; a pad opening section provided in the protective insulation layer; a wiring layer to which the pad opening section reaches; and a wiring layer provided at a level lower than the wiring layer which the pad opening section reaches, wherein the wiring layer provided at a level lower than the wiring layer which the pad opening section reaches is formed outside a region of the pad opening section as viewed in a plan view.

It is noted that the "wiring layer provided at a level lower than the wiring layer which the pad opening section reaches" means a wiring layer that is formed in an interlayer insulation layer provided below an interlayer insulation layer in which the wiring layer which the pad opening section reaches is formed.

In accordance with preferred embodiments, a wiring layer provided at a level lower than the wiring layer which the pad opening section reaches is formed outside a region of the pad opening section as viewed in a plan view. In other words, a wiring layer provided at a level lower than the wiring layer which the pad opening section reaches is not formed in a region below the pad opening section. Accordingly, even when an impact is inflicted on the wiring layer which the pad opening section reaches when wire bonding is conducted, the impact can be received by the interlayer insulation layer. As a result, generation of cracks in an interlayer insulation layer provided below the wiring layer which the pad opening section reaches can be suppressed.

The wiring layer which the pad opening section reaches may be composed of one layer in one embodiment, or two layers in another embodiment.

The wiring layer which the pad opening section reaches may be provided with a thickness that is greater than that of the wiring layer provided at a level lower than the wiring layer which the pad opening section reaches.

A second semiconductor device in accordance with certain embodiments of the present invention comprises: a first wiring layer formed above a semiconductor layer through a first interlayer insulation layer; a second wiring layer that provides a pad section formed above the first wiring layer through a second interlayer insulation layer; a protective insulation layer formed above the second wiring layer and the second interlayer insulation layer; and a pad opening section provided in the protective insulation layer, wherein an upper surface of the first interlayer insulation layer includes a first region where the protective insulation layer is formed vertically there above, and wherein the first wiring layer is formed on the first region.

The upper surface of the first interlayer insulation layer may further comprise a second region where the pad opening section is formed vertically there above, and an insulation layer is mainly formed on the second region.

The first wiring layer may further comprise a plurality of wiring layers in the same layer, and the plurality of wiring layers may be formed on the first region.

A method for manufacturing a semiconductor device may comprise the steps of: (a) forming a wiring layer on an interlayer insulation layer; (b) forming a protective insulation layer on the interlayer insulation layer and the wiring layer; and (c) forming a pad opening section in the protective insulation layer, which reaches the wiring layer; wherein the semiconductor device includes a wiring layer provided at a level lower than the wiring layer to which the pad opening section reaches; and wherein the pad opening section is formed such that the wiring layer provided at a level lower than the wiring layer to which the pad opening section reaches is formed outside a region of the pad opening section as viewed in a plan view.

Certain preferred embodiments of the present invention are described below with reference to the accompanying drawings.

Figure 2:
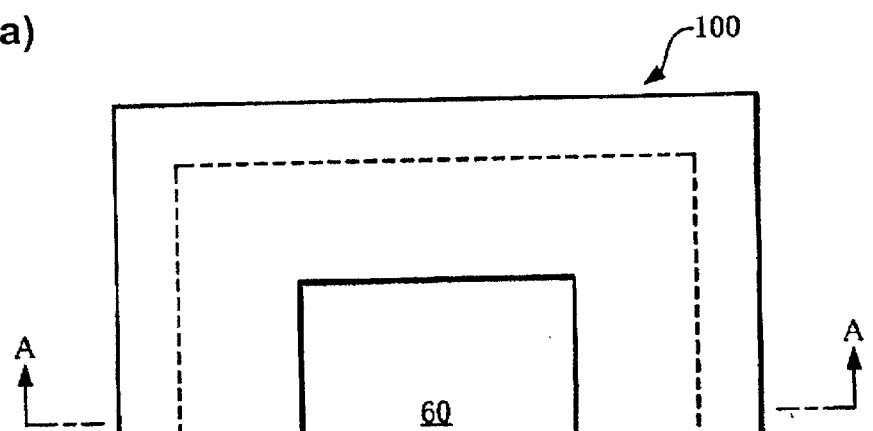
FIG. 2(a) shows an enlarged plan view of a region A10 of FIG. 1, and FIG. 2(b) schematically shows a cross-sectional view taken along lines A—A of FIG. 2(a).
Figure 2:
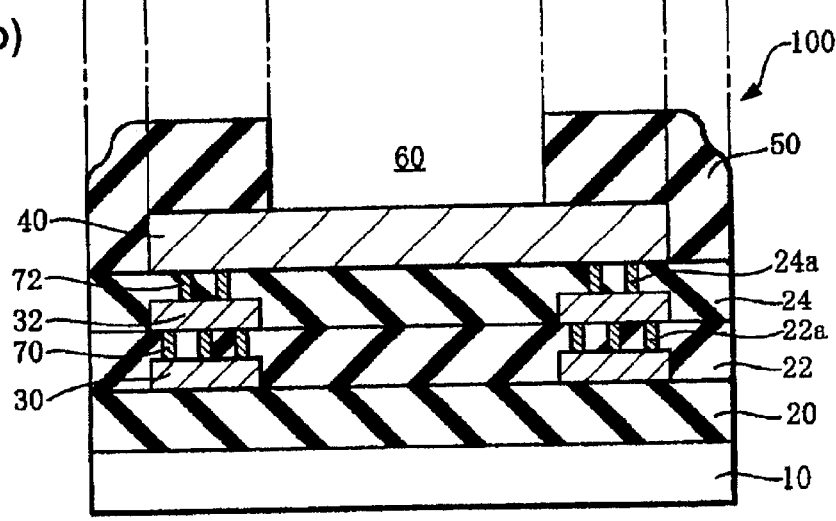

FIG. 1 schematically shows a cross-sectional view of a semiconductor device. FIG. 2(*a*) shows an enlarged view of a region A10 of FIG. 1. FIG. 2(*b*) schematically shows a cross-sectional view taken along lines A—A of FIG. 2(*a*).

First, a plane structure of a semiconductor device 1000 is described. The semiconductor device 1000 includes, as shown in FIG. 1, an active region 100 and a pad region 200. The pad region 200 is formed along the periphery of the active region.

Next, a cross-sectional structure of the semiconductor device 1000 is described. A semiconductor element is formed on a surface of the semiconductor substrate 10 in the active region. The semiconductor element includes one or more transistors, for example, MIS and/or memory transistors. A first interlayer insulation layer 20 is formed on the semiconductor substrate 10. A first wiring layer 30 is formed on the first interlayer insulation layer 20. A second interlayer insulation layer 22 is formed on the first interlayer insulation layer 20 and the first wiring layer 30. More specifically, when the first interlayer insulation layer 20 defines a first region on its upper surface above which a protective insulation layer 50 (to be described below) is formed, the first wiring layer 30 is formed on the first region. Also, when the first interlayer insulation layer 20 defines a second region on its upper surface above which a pad opening section 60 (to be described below) is formed, the second interlayer insulation layer 22 is formed on the second region. First plugs 70 are formed in the second interlayer insulation layer 22 for electrically connecting the first wiring layer 30 and a second wiring layer 32.

The second wiring layer 32 is formed on the second interlayer insulation layer 22 and the first plugs 70. A third interlayer insulation layer 24 is formed on the second interlayer insulation layer 22 and the second wiring layer 32. More specifically, when the second interlayer insulation layer 22 defines a third region on its upper surface above which the protective insulation layer 50 (to be described below) is formed, the second wiring layer 32 is formed on the third region. Also, when the second interlayer insulation layer 22 defines a fourth region on its upper surface above which the pad opening section 60 (to be described below) is formed, the third interlayer insulation layer 24 is formed on the fourth region.

A third wiring layer 40 is formed on the third interlayer insulation layer 24. The third wiring layer 40 may preferably have a thickness that is greater than either the first wiring layer 30 or the second wiring layer 32. Second plugs 72 are formed in the third interlayer insulation layer 24 for electrically connecting the third wiring layer 40 and the second wiring layer 32.

A protective insulation layer 50 is formed on the third interlayer insulation layer 24 and the third wiring layer 40. A pad opening section 60 is formed in the protective insulation layer 50. The pad opening section 60 reaches the upper surface of the third wiring layer 40. The pad opening section 60 has a width of, for example, 30–150 $\mu$m. A plane area of the pad opening section 60 is, for example, 30×30 $\mu m^2$ to 150×150 $\mu m^2$. For example, wire bonding is conducted in the pad opening section 60 for electrically connecting the exterior and the third wiring layer 40.

Next, certain characteristic aspects of the present embodiment are described. The first and second wiring layers 30 and 32 which are formed at a level below the third wiring layer 40 are formed outside a region of the pad opening section 60 as viewed in a plan view. In other words, the first and second wiring layers 30 and 32 are not formed below the region of the pad opening section 60. Accordingly, even when an impact is inflicted on the third wiring layer 40 when wire bonding is conducted, the impact can be received only by the interlayer insulation layers 20, 22 and 24. As a result, generation of cracks in the interlayer insulation layers 20, 22 and 24 provided below the third wiring layer 40 can be suppressed. Also, exfoliation of films at boundaries between the wiring layers and the interlayer insulation layers can be suppressed.

A method for manufacturing a semiconductor device in accordance with one embodiment of the present invention is described below with reference to FIG. 2.

First, a semiconductor element (for example, one or more MIS transistors or memory transistors) is formed on the semiconductor substrate 10. Next, a first interlayer insulation layer 20 composed of silicon oxide is formed by a known method. The first interlayer insulation layer 20 may be planarized, depending on the requirements, by a chemical-mechanical polishing method (CMP method).

Next, a first wiring layer 30 is formed on the first interlayer insulation layer 20. The first wiring layer 30 may be provided by forming a conduction layer (for example, an aluminum layer or an alloy layer including aluminum and copper) by a known method, and patterning the conduction layer. The first wiring layer 30 is formed in a region other than the region where the pad opening section 60 is formed.

Next, a second interlayer insulation layer 22 composed of silicon oxide is formed on the first wiring layer 30 and the first interlayer insulation layer 20 by a known method. The second interlayer insulation layer 22 may be planarized depending on the requirements by a CMP method. Then, through holes 22a that reach the first wiring layer 30 are formed in the second interlayer insulation layer 22. The through hole 22a has a width of, for example, 0.2–0.5 μm. A plane area of the through hole 22a is, for example, 0.2×0.2 μm² to 0.5×0.5 μm². Then, first plugs 70 are formed in the through holes 22a. The first plugs 70 are provided by, for example, forming a layer of tungsten on the entire surface, and etching-back the tungsten layer.

Next, a second wiring layer 32 is formed on the first plugs 70 and the second interlayer insulation layer 22. The second wiring layer 32 may be provided by forming a conduction layer (for example, an aluminum layer or an alloy layer such as an alloy including aluminum and copper) by a known method, and patterning the conduction layer. The second wiring layer 32 is formed in a region other than the region where the pad opening section 60 is formed.

Next, a third interlayer insulation layer 24 composed of silicon oxide is formed on the second interlayer insulation layer 22 and the second wiring layer 32 by a known method. The third interlayer insulation layer 24 may be planarized depending on the requirements by a CMP method. Then, through holes 24a that reach the second wiring layer 32 are formed in the third interlayer insulation layer 24. The through hole 24a has a width of, for example, 0.2–0.5 μm. A plane area of the through hole 24a is, for example, 0.2×0.2 μm² to 0.5×0.5 μm². Then, second plugs 72 are formed in the through holes 24a. The second plugs 72 are provided by, for example, forming a layer of tungsten on the entire surface, and etching-back the tungsten layer.

Next, a third wiring layer 40 is formed on the third interlayer insulation layer 24 and the second plugs 72. The third wiring layer 40 may be provided by forming a conduction layer (for example, an aluminum layer or an alloy layer such as an alloy including aluminum and copper) by a known method, and patterning the conduction layer.

Next, a protective insulation layer (for example, a silicon oxide layer) 50 is formed on the third wiring layer 40 by a known method. Then, using a lithography technique, the protective insulation layer 40 is selectively etched, to form a pad opening section 60 that reaches the third wiring layer 40. The pad opening section 60 is formed such that the first and second wiring layers 30 and 32 are disposed outside a region of the pad opening section 60 as viewed in a plan view.

Effects which may be provided by the method for manufacturing a semiconductor device in accordance with the present embodiment are described.

In accordance with the present embodiment, the first and second wiring layers 30 and 32 are formed outside a region of the pad opening section 60. Accordingly, the first and second wiring layers 30 and 32 are not formed vertically or directly below the region of the pad opening section 60, as seen in FIG. 2(b). Instead, the first and second wiring layers 30 and 32 are to the side and lower than the pad opening section 60. Another way to describe the relationship is that the first and second wiring layers 30 and 32 are formed outside of the region defined by the width (or perimeter) of the pad opening section and extending vertically downward from the pad opening section 60. As a result, stresses generated when wire bonding is conducted can be received only by the first through third interlayer insulation layers 20, 22 and 24. Therefore generation of cracks in the interlayer insulation layers 20, 22 and 24 can be suppressed. Also, separation of films at boundaries between the interlayer insulation layers and the wiring layers can be suppressed.

Examples of modifications which can be made to the present embodiment are set forth below as modified examples (1)–(7).

Figure 3:
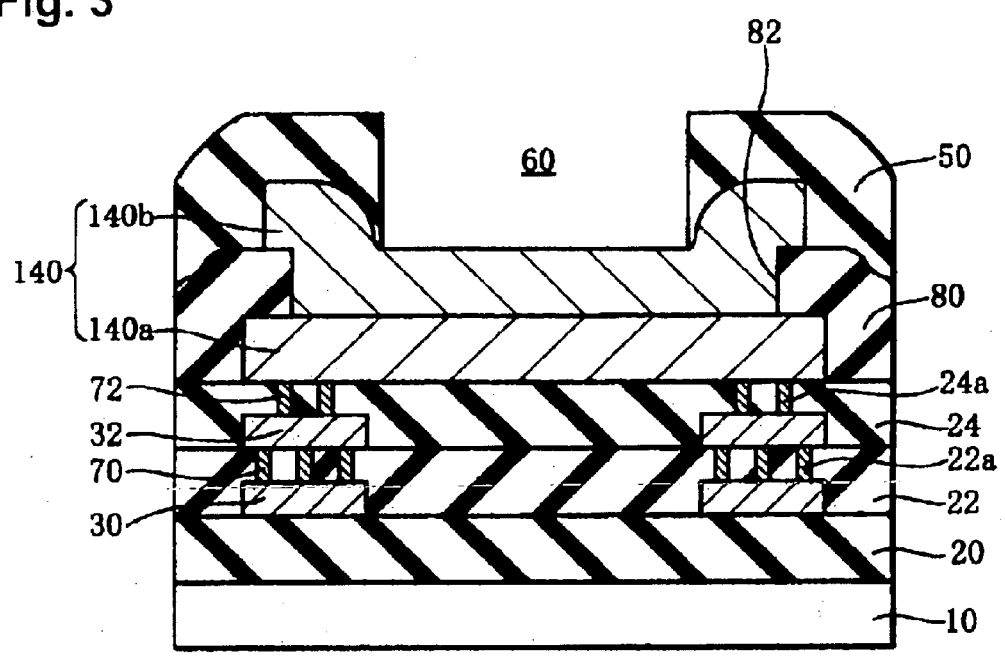
FIG. 3 schematically shows a cross-sectional view of a semiconductor device in a modified example.

(1) In the embodiment described above, the third layer 40 is formed from a single layer. However, as shown in FIG. 3, a third wiring layer 140 may have a two-layer structure. More specifically, the third wiring layer 140 may have the following structure. The third wiring layer 140 includes a lower wiring layer 140a and an upper wiring layer 140b. An insulation layer 80 is provided on the lower wiring layer 140a, and a through hole 82 is provided in the insulation layer 80. The upper wiring layer 140b is formed in a manner to fill the through hole 80, and also preferably formed to extend over at least a portion of the insulation layer 80.

It is noted that the third wiring layer 140 may also be formed from three layers or more.

Figure 4:
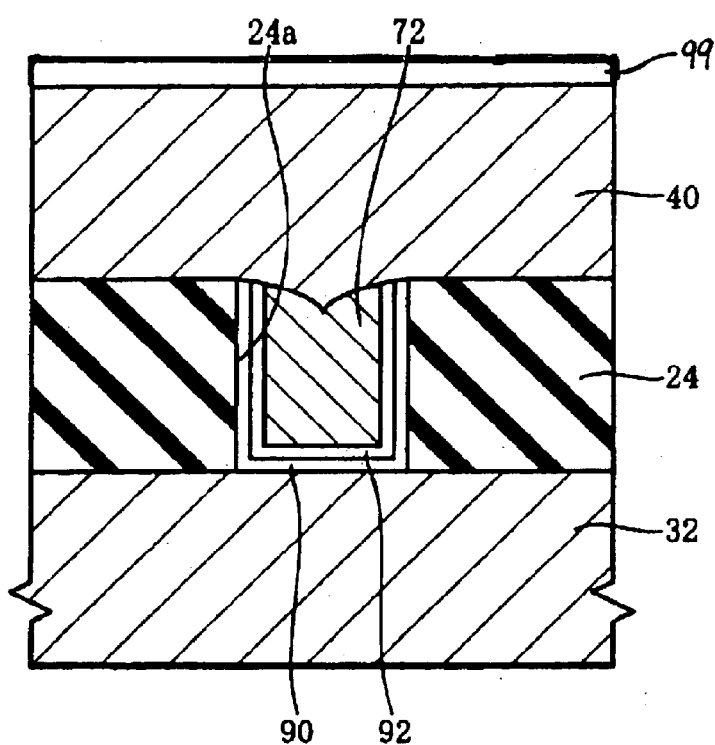
FIG. 4 schematically shows a cross-sectional view of a plug in a modified example.

(2) The second plug 72 for electrically connecting the second wiring layer 32 and the third wiring layer 40 may have the following structure. As shown in FIG. 4, a titanium film 90 and a titanium nitride film 92 may be provided between the second plug 72 and the third interlayer insulation layer 24. The thickness of the titanium film 90 may be, for example, 10–20 nm. The thickness of the titanium nitride film 92 may be, for example, 20–80 nm.

Figure 5:
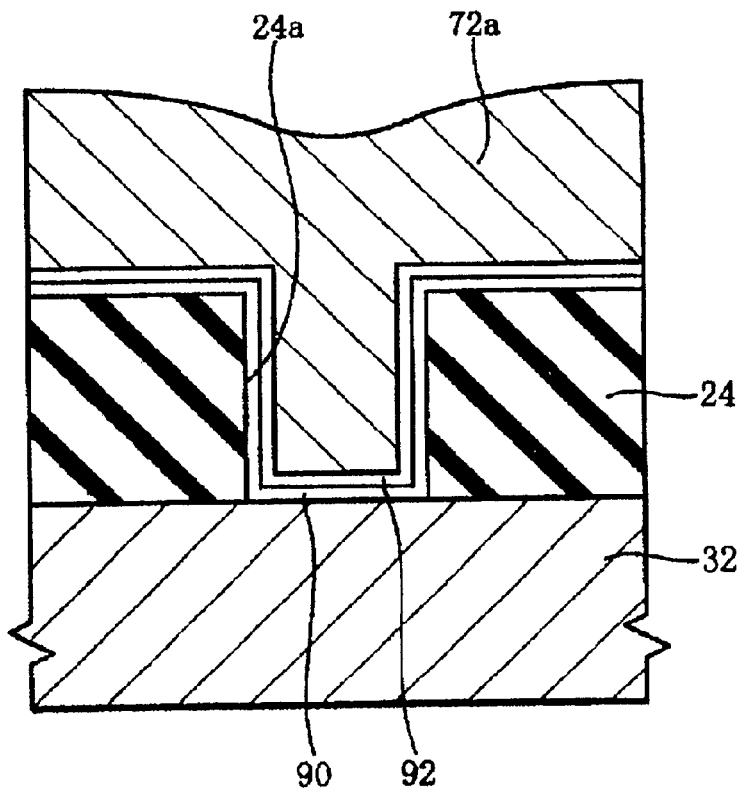
FIG. 5 schematically shows in cross section a step of forming a plug in accordance with a modified example.
Figure 6:
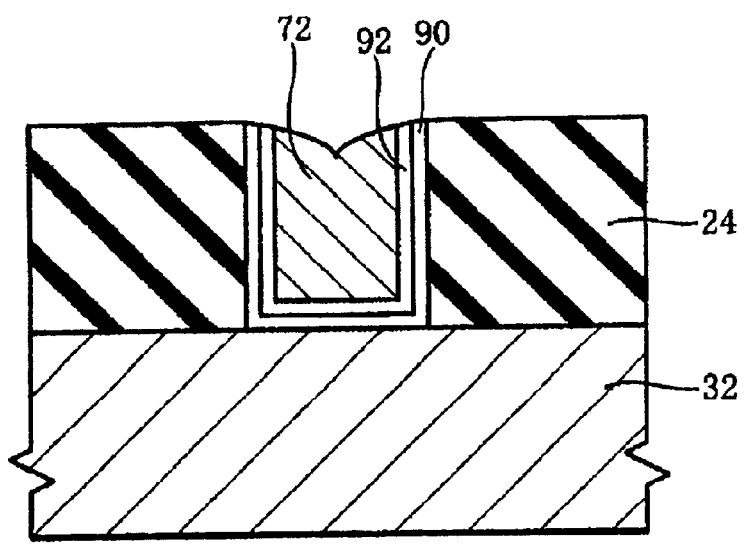
FIG. 6 schematically shows in cross section a step of forming a plug in accordance with a modified example.

The titanium film 90, the titanium nitride film 92 and the second plug 72 may be formed as follows as an example. Methods known in the art for depositing and processing the various layers may be used. First, as shown in FIG. 5, a through hole 24a that reaches the second wiring layer 32 is formed in the second interlayer insulation layer 24. Then, the titanium film 90 and the titanium nitride film 92 are successively formed on the entire surface. Then, a tungsten layer 72a is deposited. Next, as shown in FIG. 6, the tungsten layer 72a is planarized to form the second plug 72. Then, the titanium film 90 and the titanium nitride film 92 that are formed on the second interlayer insulation layer 24 are removed. For removing the titanium film 90 and the titanium nitride film 92, methods which may be used include, for example, a method using a CMP method to polish and remove them and a method using a lithography technique to selective etch them can be used.

(3) The first plug 70 may have the same structure as that of the second plug 72 in the modified example (2).

Figure 7:
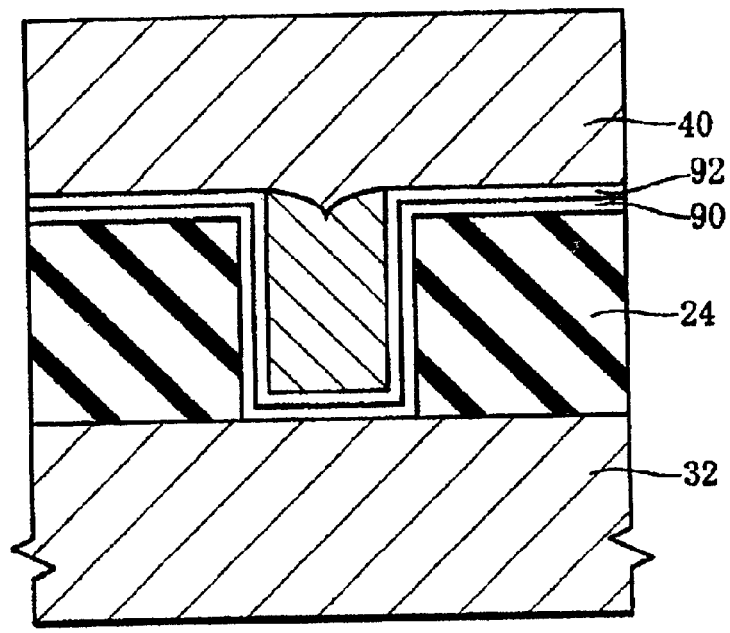
FIG. 7 schematically shows a cross-sectional view of a section of a semiconductor device in accordance with a modified example.

(4) In the modified example (2), as shown in FIG. 7, the titanium film 90 and the titanium nitride film 92 may not be removed, and the titanium film 90 and the titanium nitride film 92 may be interposed between the second interlayer insulation layer 24 and the third wiring layer 40.

(5) A reflection prevention film 99 may be formed on the third wiring layer 40. It is noted that, when a reflection prevention film 99 is formed, the reflection prevention film 99 at the pad opening section 60 may preferably be removed in order to improve the coherency between bonding structures (for example, bonding balls, bumps, etc.) and the third wiring layer 40. The reflection prevention film 99 may be formed from, for example, a titanium nitride film. The thickness of such a titanium nitride film is, for example, 20–80 nm.

(6) In the embodiment described above, the wiring layer provided below the third wiring layer 40 consists of the first wiring layer and the second wiring layer, in other words, two layers. However, one wiring layer or three or more wiring layers may alternatively be provided below the third wiring layer 40.

Figure 8:
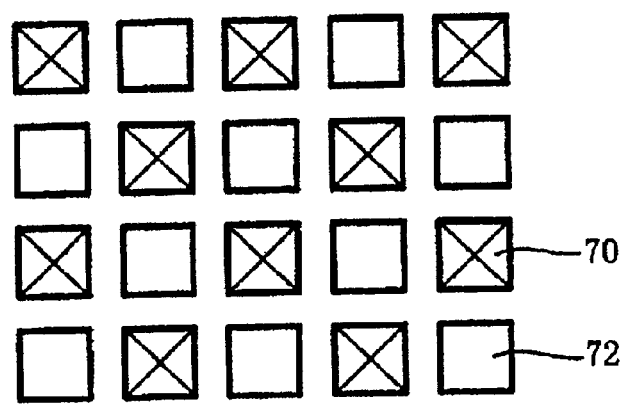
FIG. 8 shows a plan view of a plane pattern of first plugs and second plugs.
Figure 10:
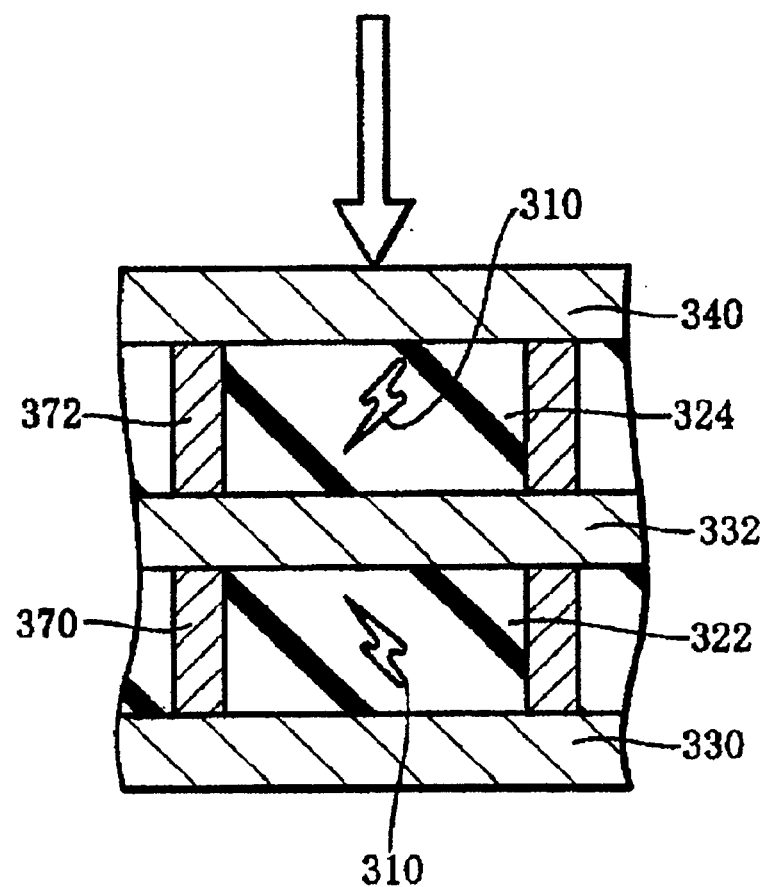
FIG. 10 schematically shows an illustration of problems of the semiconductor device of the conventional example.

(7) The first plugs 70 may be formed in a staggered manner, as shown in FIG. 8. Also, the second plugs 72 may be formed in a staggered manner, as shown in FIG. 8. The second plugs 72 can be formed such that they do not overlap the first plugs as viewed in a plan view.

By connecting the first wiring layer 30 and the second wiring layer 32 through a plurality of first plugs 70, as shown in FIG. 2(*b*) and FIG. 8, even when any of the plural first plugs 70 becomes non-conductive, the electrical connection between the first and second wiring layers can be secured by other of the first plugs 70. Also, by providing the plural plugs, the electromigration resistance can be improved. When a plurality of second plugs 72 are provided, the electrical connection between the second wiring layer 32 and the third wiring layer 40 becomes more reliable, and the electromigration resistance can be improved, in the same manner as the plurality of first plugs 70.

Also, by disposing the second plugs 72 in a manner to avoid overlapping the first plugs 70 as viewed in a plan view, the electrical resistance between the first plugs and the second plugs can be lowered.

The present invention is not limited to the embodiments described above, and many changes can be made within the scope of the subject matter of the present invention.

What is claimed:

1. A semiconductor device including a semiconductor substrate, comprising:
    a protective insulation layer;
    a pad opening section provided in the protective insulation layer;
    an upper wiring layer which the pad opening section reaches, the upper wiring layer including first and second sub-layer electrically connected to each other, the second sub-layer including an upper surface that is contacted by the pad opening section;
    a insulating layer positioned between end regions of the first and second sub-layer; and
    an additional wiring layer provided at a level lower than the wiring layer which the pad opening section reaches;
    wherein the additional wiring layer, the upper wiring layer and the protective insulation layer are all disposed above the semiconductor substrate; and
    wherein the additional wiring layer is formed outside of a region defined by the pad opening section and extending directly under the pad opening section to the semiconductor substrate.

2. A semiconductor device as in claim 1, wherein the second sub-layer upper surface that is contacted by the pad opening section is at an identical vertical level as an upper surface of the insulating layer positioned between the end regions of the first and second sub-layers.

3. A semiconductor device claim 2, wherein the first sublayer includes a lower surface, and the insulating layer positioned between the end regions of the first and second sub-layers includes an additional region having a lower surface positioned at a vertical level that is identical to that of the lower surface of the first sub-layer.

4. A semiconductor device as in claim 1, further comprising a reflection prevention film formed on at least a portion of the upper wiring layer.

5. A semiconductor device as in claim 1, wherein the first and second sub-layer have substantially the same thickness under the pad opening section.

6. A semiconductor device as in claim 5, further comprising a reflection prevention film formed on at least a portion of the upper wiring layer.

7. A semiconductor device as in claim 4, wherein the reflection prevention film is not located on the upper surface of the second sub-layer in the pad opening section.

8. A semiconductor device comprising:
    a first wiring layer formed above a semiconductor layer and above a first interlayer insulation layer;
    a second wiring layer that includes a pad section, the second wiring layer including a first sub-layer and a second sub-layer in direct contact therewith, the second wiring layer formed above the first wiring layer and above a second interlayer insulation layer;
    a protective insulation layer formed above the second wiring layer and the second interlayer insulation layer;
    a pad opening section exposing part of the second wiring layer, the pad opening section being surrounded by the protective insulation layer; and
    a third interlayer insulation layer formed on the second interlayer insulation layer, wherein a portion of the third interlayer insulation layer is positioned between end regions of the first sub-layer and the second sub-layer;
    wherein an upper surface of the first interlayer insulation layer includes a first region where the protective insulation layer is formed vertically thereabove, and the first wiring layer is formed on the first region.

9. A semiconductor device as in claim 8, wherein the second sub-layer upper surface includes a pad opening section that is contacted by the pad opening section and is at an identical vertical level as an upper surface of the insulating layer positioned between the end regions of the first and second sub-layers.

10. A semiconductor device as in claim 9, wherein the first sub-layer includes a lower surface, and the third interlayer insulating layer includes a region having a lower surface positioned at a vertical level that is identical to that of the lower surface of the first sub-layer.

11. A semiconductor device as in claim 8, further comprising a reflection prevention film formed on at least a portion of the upper wiring layer.

12. A semiconductor device as in claim 8, wherein the first and second sub-layers have substantially the same thickness under the pad opening section.

13. A semiconductor device as in claim 12, further comprising a reflection prevention film formed on at least a portion of the upper wiring layer.

14. A method for manufacturing a semiconductor device, comprising:
    forming a lower level wiring layer above a semiconductor substrate;
    forming a lower level interlayer insulation layer on and adjacent to the lower level wiring layer;
    forming a first sub-layer of an upper level wiring layer above the lower level interlayer insulation layer, wherein the lower level wiring layer is electrically connected to first sub-layer of the upper level wiring layer;
    forming an upper level insulation layer on the first sub-layer of the upper level wiring layer;
    removing part of the upper level insulation layer so that a portion of the first sub-layer is exposed and end regions of the first sub-layer are covered by the upper level insulation layer;
    forming a second sub-layer of the upper level wiring layer on the exposed portion of the first sub-layer and on the upper level insulation layer covering the end regions of the first sub-layer;

forming a protective insulation layer over the second sub-layer and over the upper level insulation layer; and removing a first portion of the protective insulation layer over a central portion of the second sub-layer to form a pad opening section, wherein a second portion of the protective insulation layer covers an outer portion of the second sub-layer, wherein no portion of the lower level wiring layer is disposed vertically below the pad opening section.

15. A method as in claim 14, further comprising forming a reflection prevention film on the second sub-layer prior to forming the protective insulation layer, and, after the removing the first portion of the protective insulation layer, removing the reflection prevention layer so that the reflection prevention film is not present on the second sub-layer in the pad opening section.

16. A method as in claim 14, further comprising forming an intermediate level wiring layer and an intermediate level interlayer dielectric layer, wherein the intermediate level wiring layer is positioned above the lower level wiring layer and below the upper level wiring layer, wherein the intermediate level interlayer dielectric layer is positioned above the lower level interlayer dielectric layer and below the upper level wiring layer, and wherein no portion of the intermediate level wiring layer is disposed vertically below the pad opening section.

17. A method as in claim 16, further comprising:
forming the lower level wiring layer to be electrically connected to the intermediate level wiring layer;
forming the intermediate level wiring layer to be electrically connected to the upper level wiring layer;
forming the lower level wiring layer to include a thickness that is less than that of the lower level interlayer dielectric layer;
forming the intermediate level wiring layer to include a thickness that is less than that of the intermediate level interlayer dielectric layer;
forming a plurality of lower level plugs to electrically connect the lower level wiring layer to the intermediate level wiring layer; and
forming a plurality of intermediate level plugs to electrically connect the intermediate level wiring layer to the upper level wiring layer;
wherein the intermediate level plugs are formed to be offset from the lower level plugs in a vertical direction.

18. A method as in claim 14, wherein the central portion of the second sub-layer includes an upper surface that is at an identical vertical level as an upper surface of the upper insulating layer that is positioned between end regions of the first and second sub-layers.

19. A semiconductor device as in claim 14, wherein the first sub-layer includes a lower surface, and the upper insulating layer includes a region having a lower surface positioned at a vertical level that is identical to that of the lower surface of the first sub-layer.

20. A semiconductor device as in claim 14, wherein the first and second sub-layers are formed to have substantially the same thickness under the pad opening section.

21. A method for manufacturing a semiconductor device, the method comprising:
forming a first interlayer insulating layer on a semiconductor substrate;
forming a first wiring layer on the first interlayer insulating layer;
forming a second interlayer insulation layer on the lower wiring layer;
forming a plurality of through-holes in the second interlayer insulating layer that contact the first wiring layer;
forming a second wiring layer on the second interlayer insulation layer and in electrical contact with the first wiring layer through the through-holes;
forming a third interlayer insulating layer on the second wiring layer;
forming a plurality of through-holes in the third interlayer insulating layer that contact the second wiring layer;
forming a first sub-layer of a third wiring layer on the third interlayer insulation layer and in electrical contact with the second wiring layer through the through-holes in the third interlayer insulating layer;
forming an additional insulating layer on the first sub-layer of the third wiring layer;
removing a central portion of the additional insulating layer to expose a region of the first sub-layer of the third wiring layer, wherein an outer portion of the additional insulating layer is not removed;
forming a second sub-layer of the third wiring layer in direct contact with the exposed region of the first sub-layer, wherein a portion of the second sub-layer is formed above an upper surface of the outer portion of the additional insulating layer;
forming a protective insulation layer on the second sub-layer and on an upper surface of the outer portion of the additional insulating layer; and
forming a pad opening section in the protective insulation layer that reaches the second sub-layer, so that the protective insulating layer extends around the pad opening section.

22. A method as in claim 21, further comprising forming the device so that the first and second wiring layers are positioned outside of a region extending vertically below the pad opening section to the semiconductor substrate, and the plurality of through-holes in the third interlayer insulating layer are offset in a vertical direction from the plurality of through-holes in the second interlayer insulating layer.

23. A method as in claim 21, further comprising forming the pad opening section and the first and second wiring layers, and the through-holes so that the first and second wiring layers are positioned outside a region of the pad opening section as viewed in a plan view.

24. A semiconductor device comprising:
a semiconductor layer;
a first wiring layer formed above the semiconductor layer;
a second wiring layer above the first wiring layer;
a third wiring layer above the second wiring layer;
a protective insulation layer formed above the third wiring layer;
a pad opening section provided in the protective insulation layer;
a plurality of first plugs positioned between the first wiring layer and the second wiring layer;
a plurality of second plugs positioned between the second wiring layer and the third wiring layer;
wherein the first wiring layer and the second wiring layer are positioned outside a region of the pad opening section as viewed in a plan view;
wherein the plurality of first plugs are positioned in a staggered manner;
wherein the plurality of second plugs are formed in a staggered manner; and
wherein the plurality of first plugs and the plurality of second plugs are positioned to be offset from each other in a vertical direction.

25. A semiconductor device as in claim 24;
wherein the plurality of first plugs comprises first, second, third and fourth rows of first plugs, wherein second and fourth rows of first plugs are staggered from the first and third rows of first plugs; and
wherein the plurality of second plugs comprises at least first, second third and fourth rows of second plugs, wherein the second and fourth rows of second plugs are offset from the first and third rows of second plugs.

26. A method for manufacturing a semiconductor device, comprising:
forming a first wiring layer above a semiconductor layer;
forming a plurality of first plugs on the first wiring layer;.
forming a second wiring layer above the first wiring layer, wherein the plurality of first plugs are disposed between the first wiring layer and the second wiring layer;
forming a plurality of second plugs on the second wiring layer;
forming a third wiring layer above the second wiring layer, wherein the plurality of second plugs are disposed between the second wiring layer and the third wiring layer;
forming a protective insulation layer above the third wiring layer;
forming a pad opening section in the protective insulation layer, which reaches the third wiring layer;
wherein the first wiring layer and the second wiring layer are formed outside a region of the pad opening section as viewed in a plan view,
wherein the plurality of first plugs are formed in a staggered manner;
wherein the plurality of second plugs are formed in a staggered manner; and
wherein the plurality of first plugs and the plurality of second plugs are positioned to be offset from each other in a vertical direction.

27. A method as in claim 26;
wherein the forming a first plurality of plugs comprises forming first through fourth rows of first plugs so that the second and fourth rows of first plugs are offset from the first and third rows of first plugs; and
wherein the forming a second plurality of plugs comprises forming first through fourth rows of second plugs so that the second and fourth rows of second plugs are offset from the first and third rows of second plugs.

* * * * *